United States Patent
Lin et al.

(10) Patent No.: US 11,694,927 B2
(45) Date of Patent: Jul. 4, 2023

(54) FORMATION METHOD OF SEMICONDUCTOR DEVICE WITH CONTACT STRUCTURES

(71) Applicant: Taiwan Semiconductor Manufacturing Company, Ltd., Hsinchu (TW)

(72) Inventors: Yi-Hsiung Lin, Zhubei (TW); Yi-Hsun Chiu, Zhubei (TW); Shang-Wen Chang, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 5 days.

(21) Appl. No.: 17/464,917

(22) Filed: Sep. 2, 2021

(65) Prior Publication Data
US 2021/0398852 A1    Dec. 23, 2021

Related U.S. Application Data

(62) Division of application No. 16/149,597, filed on Oct. 2, 2018, now Pat. No. 11,127,631.

(60) Provisional application No. 62/697,582, filed on Jul. 13, 2018.

(51) Int. Cl.
| | | |
|---|---|---|
| H01L 21/768 | (2006.01) |
| H01L 23/528 | (2006.01) |
| H01L 23/535 | (2006.01) |
| H01L 29/08 | (2006.01) |
| H01L 29/78 | (2006.01) |
| H01L 29/66 | (2006.01) |
| H01L 29/06 | (2006.01) |

(52) U.S. Cl.
CPC .. *H01L 21/76897* (2013.01); *H01L 21/76805* (2013.01); *H01L 21/76895* (2013.01); *H01L 23/5283* (2013.01); *H01L 23/535* (2013.01); *H01L 29/0653* (2013.01); *H01L 29/0847* (2013.01); *H01L 29/66795* (2013.01); *H01L 29/7848* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |

(Continued)

*Primary Examiner* — Erik Kielin
(74) *Attorney, Agent, or Firm* — McClure, Qualey & Rodack, LLP

(57) ABSTRACT

A structure and a formation method of a semiconductor device are provided. The method includes forming a first source/drain structure and a second source/drain structure over a semiconductor substrate. The method also includes forming a dielectric layer over the first source/drain structure and the second source/drain structure and forming a conductive contact on the first source/drain structure. The method further includes forming a first conductive via over the conductive contact, and the first conductive via is misaligned with the first source/drain structure. In addition, the method includes forming a second conductive via directly above the second source/drain structure, and the second conductive via is longer than the first conductive via.

20 Claims, 7 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2008/0211106 A1 | 9/2008 | Chang et al. |
| 2009/0014796 A1 | 1/2009 | Liaw |
| 2010/0095263 A1 | 4/2010 | Frederick |
| 2013/0043530 A1* | 2/2013 | Kim ............... H01L 27/228 |
| | | 257/334 |
| 2016/0027703 A1 | 1/2016 | Do et al. |
| 2016/0190141 A1 | 6/2016 | Lee et al. |
| 2017/0125289 A1 | 5/2017 | Adusumilli et al. |
| 2019/0013241 A1 | 1/2019 | Xie et al. |
| 2019/0067131 A1 | 2/2019 | Liaw |
| 2019/0123162 A1 | 4/2019 | Xie et al. |

* cited by examiner

FORMATION METHOD OF SEMICONDUCTOR DEVICE WITH CONTACT STRUCTURES

PRIORITY CLAIM AND CROSS-REFERENCE

This Application is a Divisional of U.S. application Ser. No. 16/149,597, filed on Oct. 2, 2018, issued on Sep. 21, 2021, as U.S. Pat. No. 11,127,631, which claims the benefit of U.S. Provisional Application No. 62/697,582, filed on Jul. 13, 2018, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
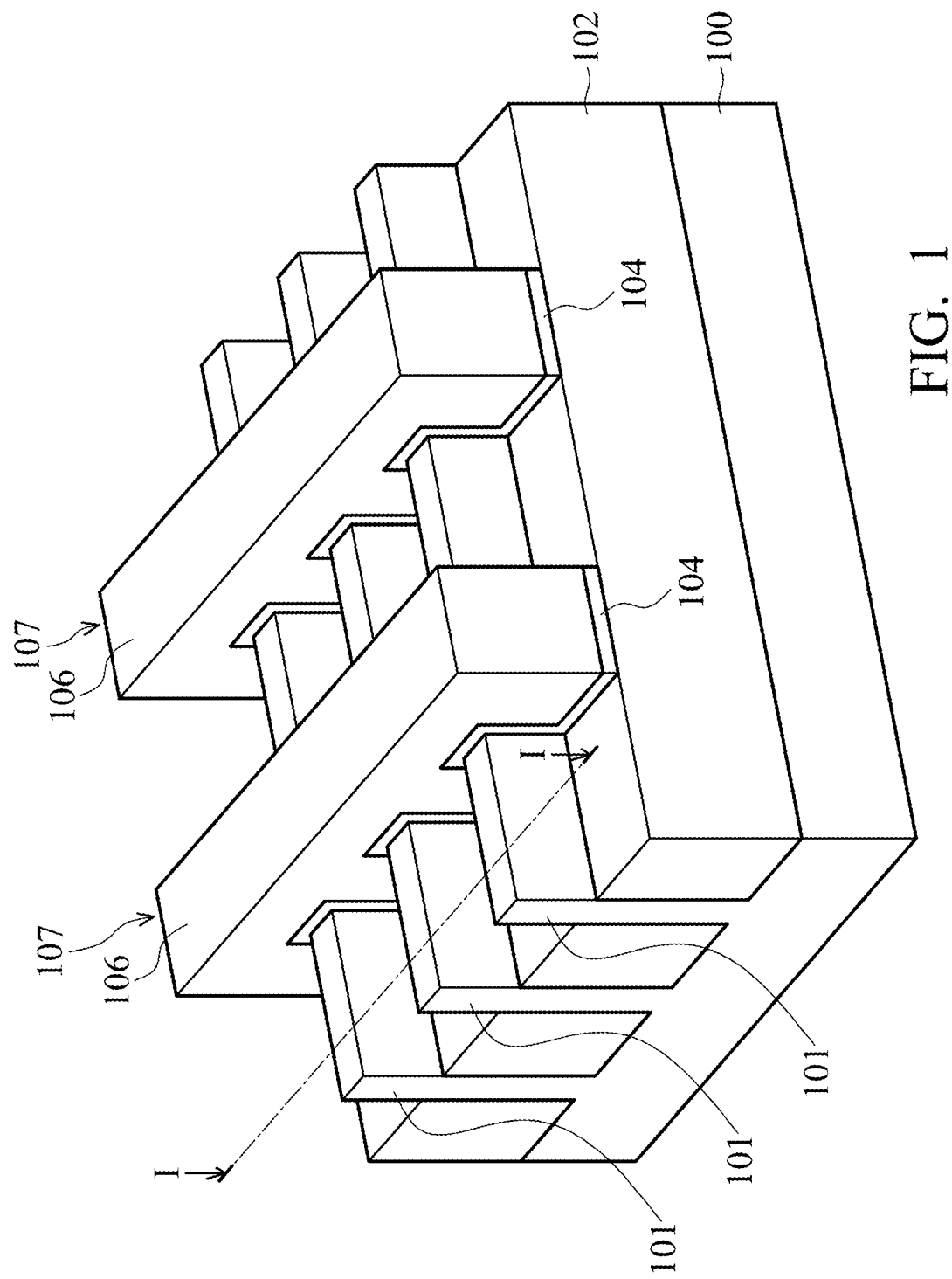
FIG. 1 is a perspective view of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIG. 1 is a perspective view of a semiconductor device structure, in accordance with some embodiments. A semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (such as p-type, n-type, or a combination thereof). In some embodiments, portions of the semiconductor substrate 100 are doped with dopants to form well regions. Multiple ion implantation processes may be used to form the well regions. In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

Afterwards, patterned mask elements (not shown) are formed over the semiconductor substrate 100 to assist in a subsequent formation of semiconductor fins, in accordance with some embodiments. One or more etching processes may be used to partially remove the semiconductor substrate 100. As a result, multiple recesses and semiconductor fins 101 are formed, as shown in FIG. 1.

Afterwards, isolation features 102 are formed over the semiconductor substrate 100 to surround lower portions of the semiconductor fins 101, as shown in FIG. 1 in accordance with some embodiments. In some embodiments, a dielectric material layer is deposited over the semiconductor substrate 100 to cover and surround the semiconductor fins 101. The dielectric material layer may be made of or include silicon oxide, silicon nitride, silicon oxynitride, fluorinated silicate glass (FSG), low-K dielectric material, one or more other suitable materials, or a combination thereof. The dielectric material layer may be deposited using a chemical vapor deposition (CVD) process, an atomic layer deposition (ALD) process, a physical vapor deposition (PVD) process, a spin-on process, one or more other applicable processes, or a combination thereof.

A planarization process is then used to thin the dielectric material layer until the semiconductor fins 101 or the mask elements used for defining the semiconductor fins 101 are exposed. The planarization process may include a chemical mechanical polishing (CMP) process, a grinding process, a dry polishing process, an etching process, one or more other applicable processes, or a combination thereof.

Afterwards, the mask elements used for defining the semiconductor fins 101 are removed, and the dielectric material layer is partially removed, in accordance with some embodiments. For example, the dielectric material layer is etched back. As a result, the remaining portions of the dielectric material layer form the isolation features 102, as shown in FIG. 1. The isolation features 102 surround the lower portions of the semiconductor fins 101. Upper portions of the semiconductor fins 101 protrude from the top surfaces of the isolation features 102.

As shown in FIG. 1, one or more gate stacks 107 are formed over the semiconductor substrate 100 to partially cover the semiconductor fins 101 and the isolation features 102, as shown in FIG. 1 in accordance with some embodiments. The gate stacks 107 extend across the semiconductor fins 101. Each of the gate stacks 107 includes a gate electrode 106 and a gate dielectric layer 104. In some embodiments, a gate dielectric material layer and a gate electrode material layer are deposited over the isolation features 102 and the semiconductor fins 101. Afterwards, the gate dielectric material layer and the gate electrode material layer are patterned to form the gate stacks 107.

In some embodiments, the gate dielectric material layer for forming the gate dielectric layer 104 is made of or includes silicon oxide, silicon nitride, silicon oxynitride, dielectric material with a high dielectric constant (high-K), one or more other suitable dielectric materials, or a combination thereof. In some embodiments, the gate dielectric material layer is a dummy gate dielectric layer that will be subsequently removed. The dummy gate dielectric material layer is, for example, a silicon oxide layer.

In some embodiments, the gate dielectric material layer is deposited using a chemical vapor deposition (CVD) process, an atomic layer deposition (ALD) process, a thermal oxidation process, a physical vapor deposition (PVD) process, one or more other applicable processes, or a combination thereof.

In some embodiments, the gate electrode material layer is made of or includes polysilicon, amorphous silicon, germanium, silicon germanium, one or more other suitable materials, or a combination thereof. In some embodiments, the gate electrode material layer is a dummy gate electrode layer that is made of or includes a semiconductor material such as polysilicon. For example, the dummy gate electrode layer is deposited using a CVD process or another applicable process.

Afterwards, epitaxial growth processes are performed to form source/drain structures, in accordance with some embodiments. FIGS. 2A-2H are cross-sectional views of various stages of a process for forming a semiconductor device structure, in accordance with some embodiments. In some embodiments, FIGS. 2A-2H are cross-sectional views of various subsequent stages of a process for forming a semiconductor device structure taken along line I-I in FIG. 1.

Figure 2A:
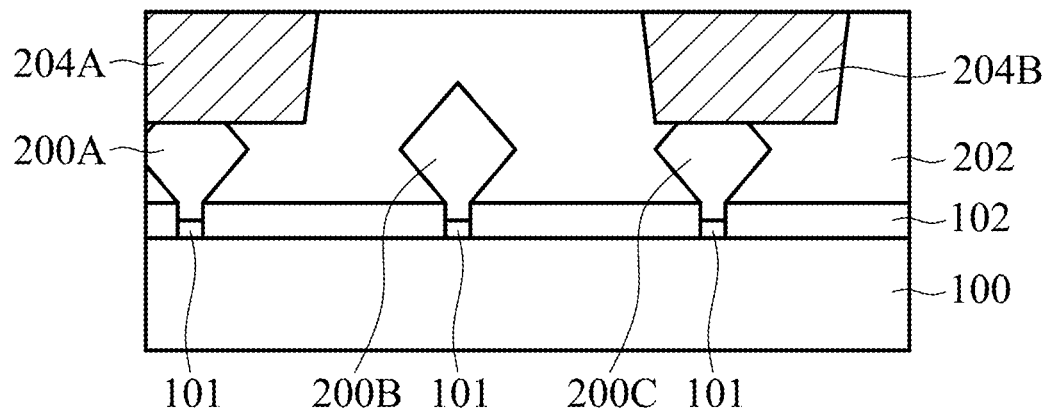
FIGS. 2A-2H are cross-sectional views of various stages of a process for forming a semiconductor device structure, in accordance with some embodiments.

As shown in FIG. 2A, the semiconductor fins 101 are partially removed to form recessed semiconductor fins 101, in accordance with some embodiments. In some embodiments, the recessed semiconductor fins 101 are recessed to a level below the top surfaces of the isolation features 102. In some other embodiments, the recessed semiconductor fins 101 are recessed to a level above the top surfaces of the isolation features 102. In some embodiments, one or more etching processes is/are used to recessing the semiconductor fins 101.

Many variations and/or modifications can be made to embodiments of the disclosure. In some other embodiments, the semiconductor fins 101 are not recessed. In some other embodiments, the semiconductor fins 101 are merely thinned without being recessed to a level below the top surfaces of the isolation features 102.

As shown in FIG. 2A, one or more semiconductor materials are epitaxially grown over the recessed semiconductor fins 101, in accordance with some embodiments. As a result, epitaxial structures 200A, 200B, and 200C are formed. The epitaxial structures 200A, 200B, and 200C may function as source/drain structures. The epitaxial structures 200A, 200B, and 200C may also function as stressors to improve carrier mobility.

In some embodiments, the epitaxial structures 200A, 200B, and 200C are doped with the same type dopants. For example, the epitaxial structures 200A, 200B, and 200C are p-type doped. Alternatively, the epitaxial structures 200A, 200B, and 200C are n-type doped.

In some embodiments, two of the epitaxial structures 200A, 200B, and 200C are doped with different types of dopants. For example, the epitaxial structures 200A and 200B are n-type doped, and the epitaxial structure 200C is p-type doped. Alternatively, the epitaxial structures 200A and 200B are p-type doped, and the epitaxial structure 200C is n-type doped. The epitaxial structures doped with different types of dopants may be formed separately in different epitaxial growth processes. Mask elements may be used to assist in the formation of the epitaxial structures doped with different types of dopants.

The p-type doped epitaxial structures may be used as p-type source/drain structures. The p-type doped epitaxial structures may include epitaxially grown silicon germanium, epitaxially grown germanium, or one or more other suitable epitaxially grown semiconductor materials. The p-type doped epitaxial structures may include p-type dopants such as boron, gallium, indium, one or more other suitable dopants, or a combination thereof.

The n-type doped epitaxial structures may be used as n-type source/drain structures. The n-type doped epitaxial structures may include epitaxially grown silicon or another suitable epitaxially grown semiconductor material. The n-type doped epitaxial structures may include n-type dopants such as phosphor, arsenic, one or more other suitable dopants, or a combination thereof.

In some embodiments, the epitaxial structures 200A, 200B, and 200C are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, an ALD process, one or more other applicable processes, or a combination thereof. The process of forming the epitaxial structures 200A, 200B, and 200C may use gaseous and/or liquid precursors.

In some embodiments, the epitaxial structures 200A, 200B, and 200C are doped in-situ during the growth of the epitaxial structures 200A, 200B, and 200C. However, embodiments of the disclosure are not limited thereto. In some other embodiments, one or more doping processes are used to dope the epitaxial structures 200A, 200B, and 200C after the epitaxial growth of the epitaxial structures 200A, 200B, and 200C. In some embodiments, the doping is achieved using an ion implantation process, a plasma immersion ion implantation process, a gas and/or solid source diffusion process, one or more other applicable processes, or a combination thereof.

Afterwards, a dielectric layer 202 is deposited to cover the epitaxial structures 200A, 200B, and 200C, as shown in FIG. 2A in accordance with some embodiments. In some embodiments, a dielectric material layer is deposited over the epitaxial structures 200A, 200B, and 200C and the gate stacks 107. The dielectric material layer may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable dielectric materials, or a combination thereof.

In some embodiments, the dielectric material layer is deposited using a CVD process, an ALD process, a PVD process, a spin-on process, one or more other applicable processes, or a combination thereof. Afterwards, the dielectric material layer is partially removed using a planarization process until the gate stacks 107 are exposed. The planarization process may include a CMP process, a grinding process, a dry polishing process, an etching process, one or more other applicable processes, or a combination thereof. As a result, the remaining portion of the dielectric material layer forms the dielectric layer 202.

A gate replacement process may then be performed to replace the gate stacks 107 with a metal gate stack. In some embodiments, the gate stacks 107 are removed to form trenches that are surrounded by the dielectric layer 202. One or more etching processes are used to remove the gate electrode 106 and the gate dielectric layer 104.

Afterwards, material layers for forming metal gate stacks are deposited to fill the trenches originally occupied by the gate stacks 107. The material layers may include a high-k dielectric layer, work function layers, and metal filling layers. The material layers may further include barrier layers, buffer layers, and/or blocking layers. A planarization process may be used to remove the portions of the material layers outside of the trenches. As a result, the remaining portions of the material layers in the trenches form multiple metal gate stacks. In some embodiments, protective elements (not shown) are formed over the metal gate stacks to protect the metal gate stacks from being damaged during subsequent formation process.

Afterwards, conductive contacts 204A and 204B are respectively formed to provide corresponding electrical connections to the epitaxial structures 200A and 200C, as shown in FIG. 2A in accordance with some embodiments. In some embodiments, contact openings are formed in the dielectric layer 202. The contact openings expose the epitaxial structures 200A and 200C. The contact openings may be formed using a photolithography process and an etching process.

Afterwards, a conductive material layer is deposited over the dielectric layer 202 to fill the contact openings, in accordance with some embodiments. The conductive material layer may be made of or include ruthenium, cobalt, tungsten, titanium, molybdenum, titanium nitride, tantalum nitride, tungsten nitride, one or more other suitable materials, or a combination thereof. The conductive material layer may be deposited using an ALD process, a CVD process, a PVD process, an electroplating process, one or more other applicable processes, or a combination thereof.

Afterwards, a planarization process is used to remove the conductive material layer outside of the contact openings, in accordance with some embodiments. As a result, the remaining portions of the conductive material layer in the contact openings form the conductive contacts 204A and 204B, as shown in FIG. 2A in accordance with some embodiments. The planarization process mentioned above may include a CMP process, a grinding process, an etching process, a dry polishing process, one or more other applicable processes, or a combination thereof.

Many variations and/or modifications can be made to embodiments of the disclosure. In some embodiments, metal-semiconductor compound layers are formed on the epitaxial structures 200A, 200B, and 200C before the formation of the conductive contacts 204A and 204B. The metal-semiconductor compound layers may be made of or include metal silicide or other suitable materials.

In some embodiments, the conductive contacts 204A and 204B are selectively formed over the epitaxial structures 200A and 200C. In some embodiments, no conductive contact is formed directly above the epitaxial structure 200B. The conductive contact 204A may be used to form an electrical connection between the epitaxial structure 200A and a conductive line that is to be formed over the conductive contact 204A but not directly above the epitaxial structure 200A. Similarly, the conductive contact 204B may be used to form an electrical connection between the epitaxial structure 200C and a conductive line that is to be formed over the conductive contact 204B but not directly above the epitaxial structure 200C. Because the conductive contacts are selectively formed over specific epitaxial structures but not over each of the epitaxial structures, the distribution density of the conductive contacts may be significantly reduced. The process for forming the conductive contacts becomes easier. Short circuiting between nearby conductive contacts may be prevented. The quality and reliability of the conductive contacts are improved further.

Figure 2B:
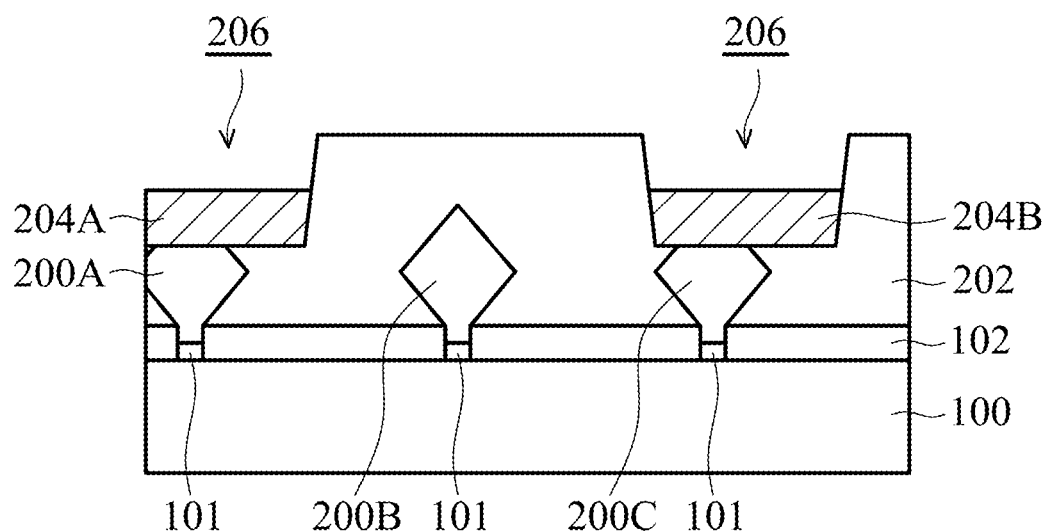

As shown in FIG. 2B, the conductive contacts 204A and 204B are partially removed to form recesses 206, in accordance with some embodiments. The conductive contacts 204A and 204B may be etched back to form the recesses 206. After the etching back process, the top surfaces of the conductive contacts 204A and 204B are below the top surface of the dielectric layer 202.

Figure 2C:
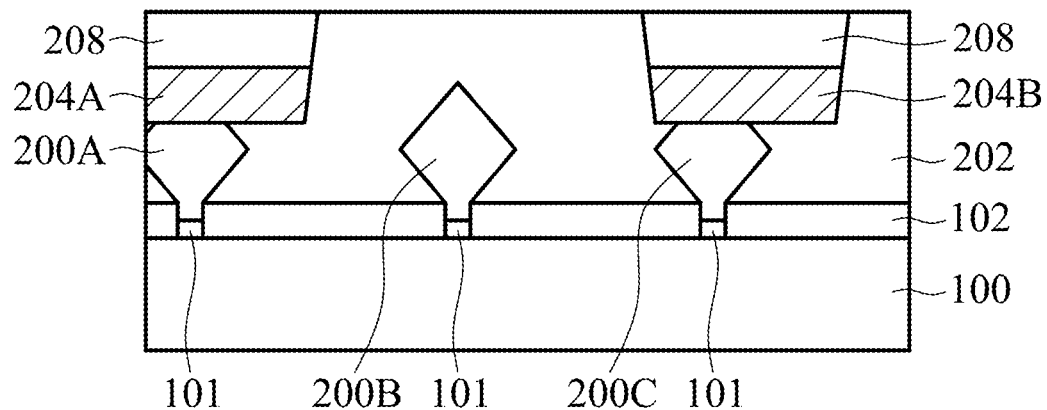

As shown in FIG. 2C, protective elements 208 are formed in the recesses 206, in accordance with some embodiments. The protective elements 208 are surrounded by the dielectric layer 202. The protective elements 208 may protect the conductive contacts 204A and 204B thereunder from being damaged during subsequent formation processes. For example, the protective elements 208 may protect the conductive contacts 204A and 204B during the formation of via openings exposing the metal gate stacks.

The protective elements 208 may be made of or include silicon nitride, silicon carbide, silicon oxynitride, one or more other suitable materials, or a combination thereof. In some embodiments, a protective material layer is deposited over the dielectric layer 202 to fill the recesses 206. Afterwards, a planarization process is used to remove the portion of the protective material layer outside of the recesses 206. As a result, the remaining portions of the protective material layer in the recesses 206 form the protective elements 208. The planarization process may include a CMP process, a grinding process, a dry polishing process, an etching process, one or more other applicable processes, or a combination thereof.

Figure 2D:
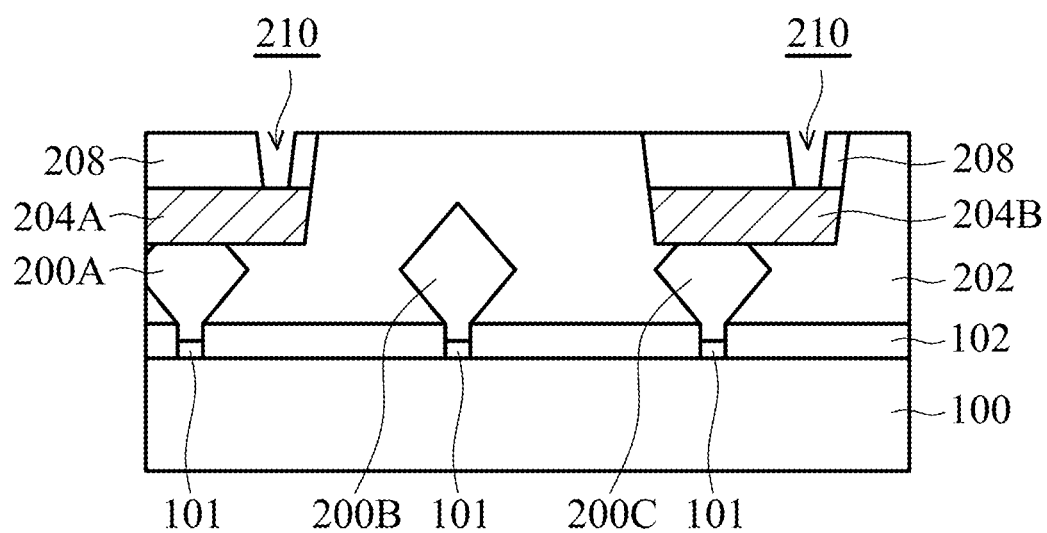

As shown in FIG. 2D, the protective elements 208 are partially removed to form openings 210, in accordance with some embodiments. The openings 210 expose the conductive contacts 204A and 204B, respectively. Each of the openings 210 is not directly above the epitaxial structures 200A and 200B. A photolithography process and an etching process may be used to form the openings 210.

Figure 2E:
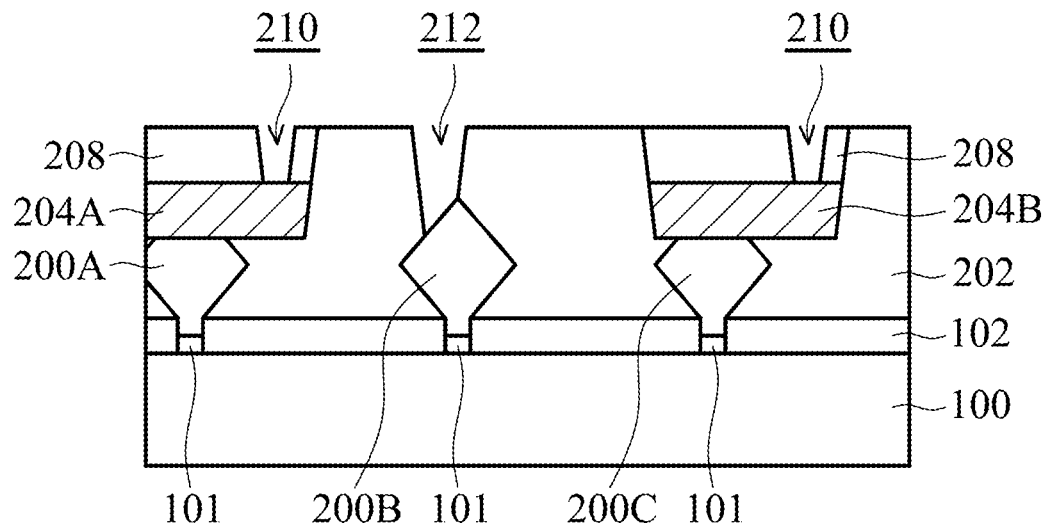

As shown in FIG. 2E, an opening 212 is formed in the dielectric layer 202 to expose the epitaxial structure 200B or a metal-semiconductor compound layer formed on the epitaxial structure 200B, in accordance with some embodiments. The opening 212 extends deeper into the dielectric layer 202 than the openings 210. A photolithography process and an etching process may be used to form the opening 212. The photoresist layer formed in the photolithography process may fill the openings 210 during the etching process for forming the opening 212. The photoresist layer may therefore protect the conductive contacts 204A and 204B from being damaged in the etching process.

Many variations and/or modifications can be made to embodiments of the disclosure. In some other embodiments, the opening 212 is formed before the openings 210.

Figure 2F:
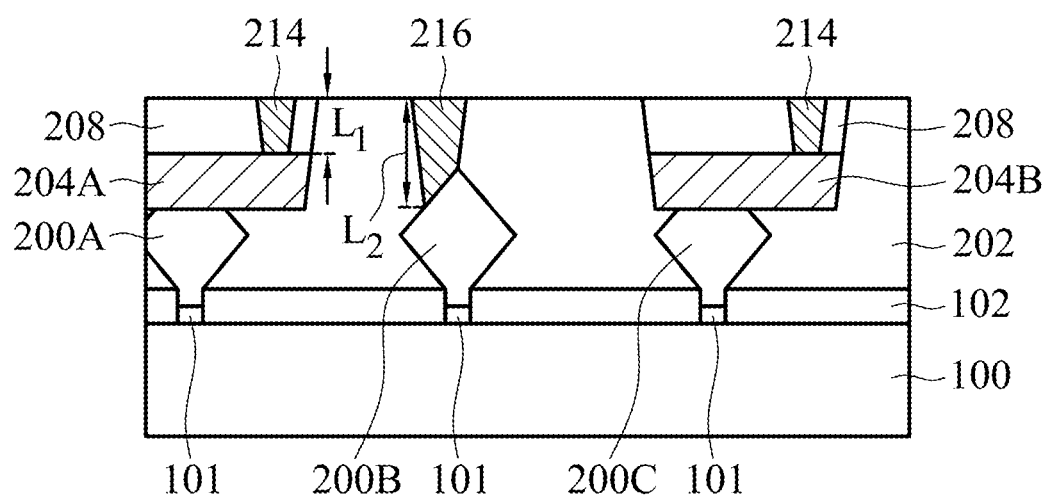

As shown in FIG. 2F, conductive vias 214 and a conductive via 216 are respectively formed in the openings 210 and 212, in accordance with some embodiments. As shown in FIG. 2F, each of the conductive vias 214 has a length $L_1$ (or height), and the conductive via 216 has a length $L_2$ (or height). In some embodiments, the length $L_2$ is greater than the length $L_1$. The conductive via 216 is longer (or higher) than the conductive via 214, as shown in FIG. 2F.

In some embodiments, a conductive material layer is deposited over the dielectric layer 202 and the protective elements 208 to fill the openings 210 and 212. The conductive material layer may be made of or include ruthenium, cobalt, tungsten, titanium, molybdenum, titanium nitride, tantalum nitride, tungsten nitride, one or more other suitable materials, or a combination thereof. The conductive material layer may be deposited using a CVD process, an ALD process, a PVD process, an electroplating process, an electroless plating process, one or more other applicable processes, or a combination thereof.

Afterwards, a planarization process is used to remove the portion of the conductive material layer outside of the openings 210 and 212. As a result, the remaining portions of the conductive material layer in the openings 210 form the conductive vias 214. The remaining portion of the conductive material layer in the opening 212 form the conductive via 216. In some embodiments, the conductive vias 214 and 216 are made of the same material. In some embodiments, the top surfaces of the conductive vias 214 and 216 are substantially coplanar. For example, the top surfaces of the conductive vias 214 and 216 and the dielectric layer 202 are substantially coplanar.

Many variations and/or modifications can be made to embodiments of the disclosure. In some other embodiments, the conductive vias 214 and 216 are made of different materials. In some embodiments, the conductive vias 214 and 216 are formed in different processes. In some embodiments, after the formation of the openings 210, the conductive vias 214 is formed to fill the openings 212. Afterwards, the opening 212 is formed and then filled with the conductive via 216. In these cases, the conductive vias 214 and 216 may be made of different materials.

Figure 2G:
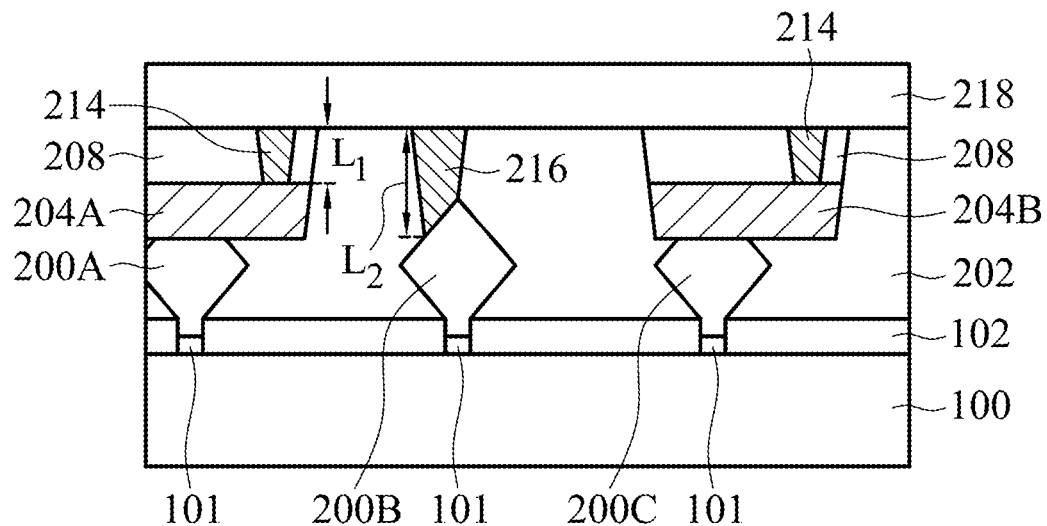

As shown in FIG. 2G, a dielectric layer 218 is deposited over the dielectric layer 202, the protective elements 208, and the conductive vias 214 and 216, in accordance with some embodiments. The material and formation method of the dielectric layer 218 may be the same as or similar to those of the dielectric layer 202.

Figure 2H:
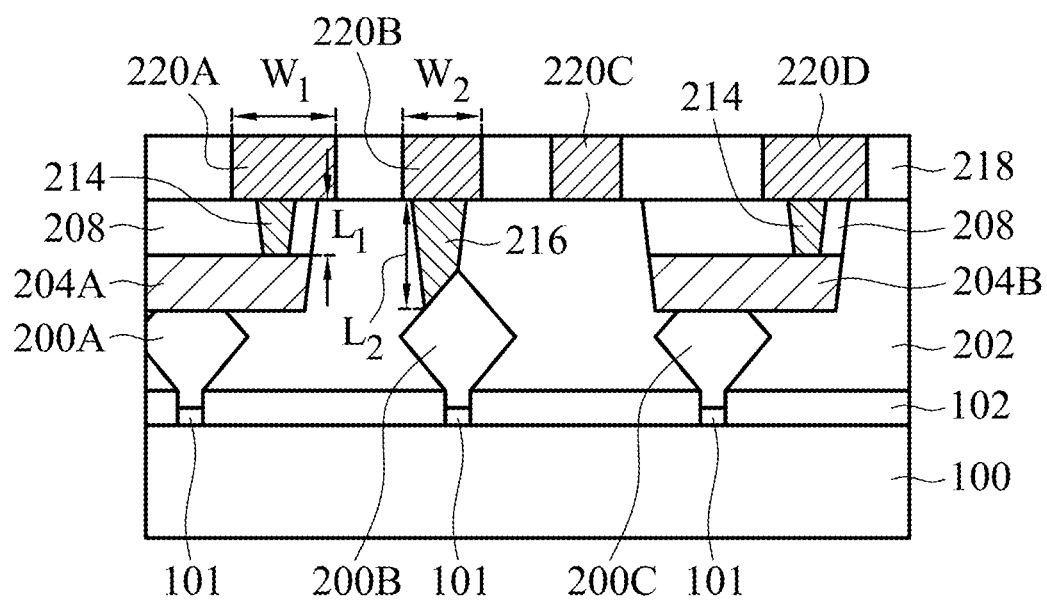

As shown in FIG. 2H, conductive lines 220A, 220B, 220C, and 220D are formed in the dielectric layer 218, in accordance with some embodiments. In some embodiments, the conductive lines 220A and 220D are used as power rails that are designed to carry large current. The conductive lines 220B and 220C are designed to transmit electrical signals and carry less current. The conductive line 220A or 220D has a width $W_1$, and the conductive line 220B or 220C has a width $W_2$. In some embodiments, the width $W_1$ is greater than the width $W_2$. The conductive line 220A or 220D is wider than the conductive line 220B or 220C.

The conductive lines 220A, 220B, 220C, and 220D may be formed using a single damascene process. The conductive lines 220A, 220B, 220C, and 220D may be made of or include copper, aluminum, cobalt, titanium, gold, platinum, one or more other suitable materials, or a combination thereof.

In some embodiments, the conductive line 220A is electrically connected to the conductive contact 204A through one of the conductive vias 214, as shown in FIG. 2H. Because the conductive line 220A and the conductive via 214 are not directly above the epitaxial structure 200A, the conductive contact 204A may form an electrical connection between the conductive via 214 and the epitaxial structure 200A. Similarly, the conductive contact 204B may form an electrical connection between the epitaxial structure 200C and the conductive line 220D, which are not aligned with each other in a vertical direction.

Figure 4:
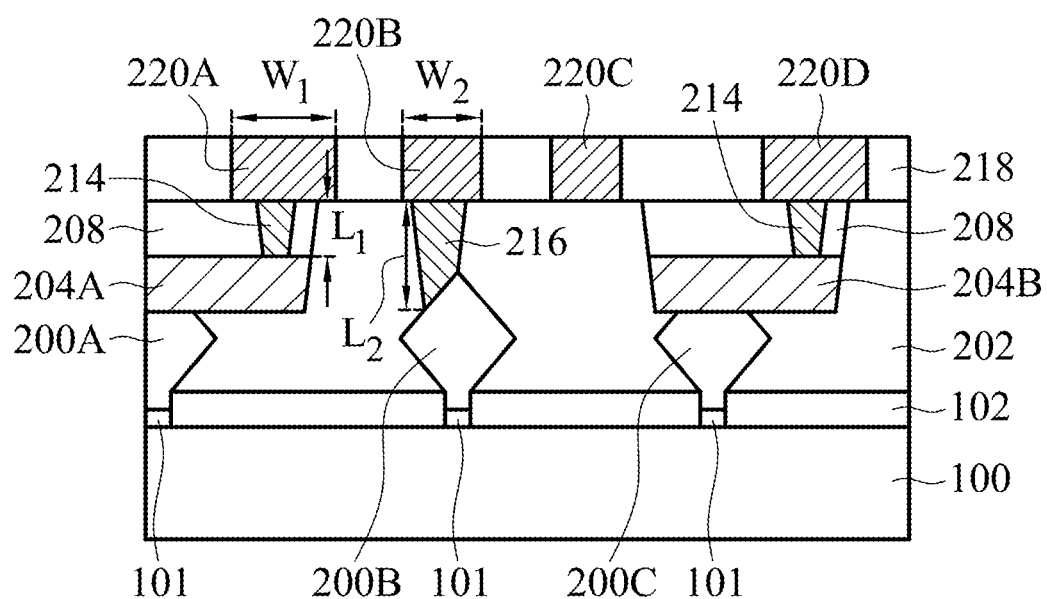
FIG. 4 is a cross-sectional view of a semiconductor device structure, in accordance with some embodiments.

In some embodiments, a portion of the conductive line 220B is directly above the epitaxial structure 200B. In some embodiments, no part of the conductive line 220A is directly above the epitaxial structure 200A, as shown in FIG. 4.

The conductive line 220B is electrically connected to the epitaxial structure 200B through the conductive via 216. The conductive via 216 is aligned with the conductive line 220B and the epitaxial structure 200B. In some embodiments, no conductive contact is formed between the conductive via 216 and the epitaxial structure 200B. Therefore, the conductive contact 204A or 204B would not be too close to another conductive contact. The quality and reliability of the conductive contacts 204A and 204B are greatly improved. It is not needed to form a conductive contact that is short and very close to nearby conductive contacts. Therefore, the formation process of the conductive contacts is much easier.

Figure 3:
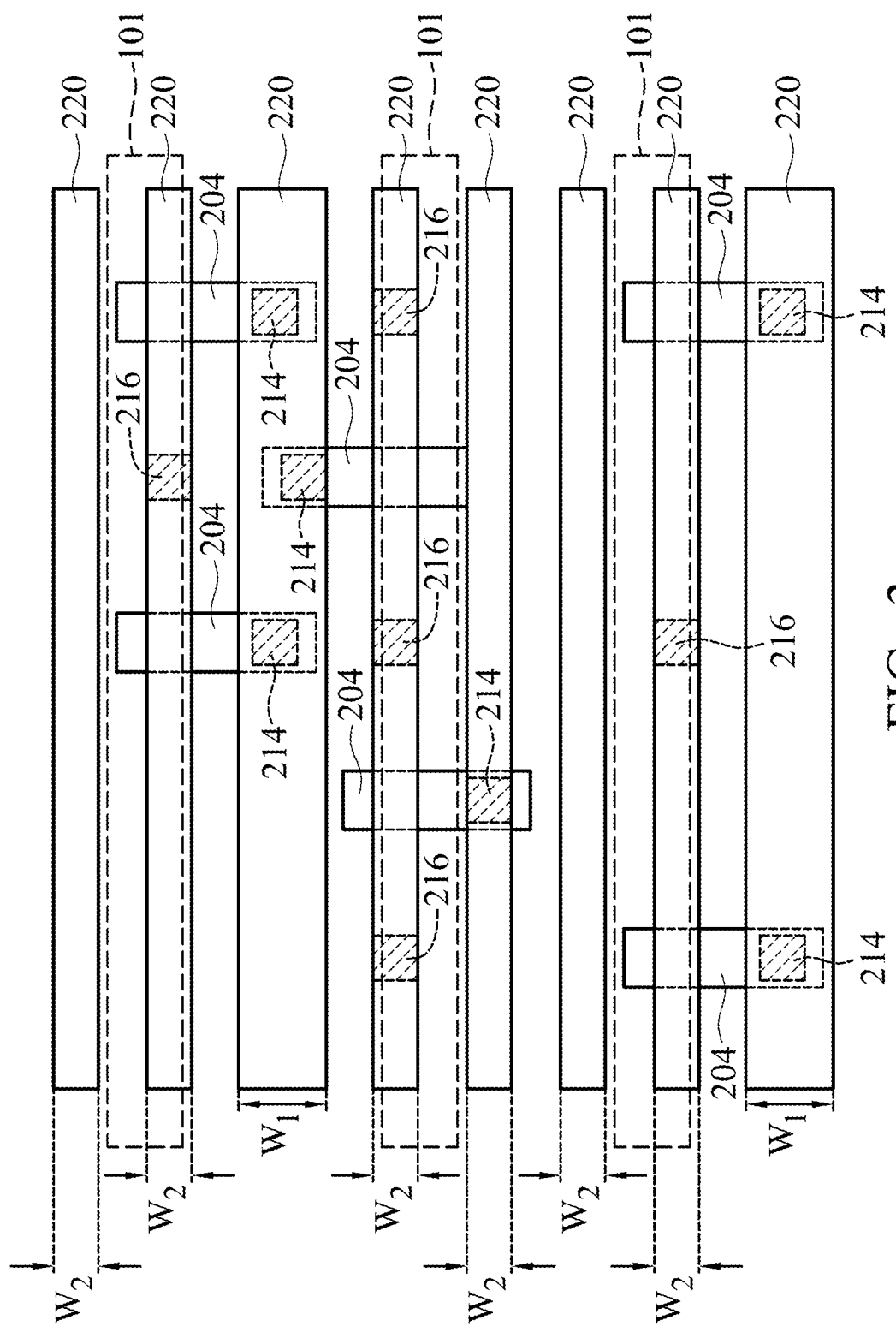
FIG. 3 is a top layout view of a semiconductor device structure, in accordance with some embodiments.

FIG. 3 is a top layout view of a semiconductor device structure, in accordance with some embodiments. In some embodiments, the conductive contacts 204 are selectively formed to form an electrical connection between the active regions of the semiconductor fins 101 and the conductive lines 220 not directly above the semiconductor fins 101. The conductive vias 214 are used to electrically couple the conductive lines 220 and the conductive contacts 204. The conductive vias 216 are used to form a direct electrical connection between the conductive lines 220 directly above the semiconductor fins 101. Because the conductive contacts 204 are only formed over selective epitaxial structures, the density of the conductive contacts 204 is reduced. The formation of the conductive contacts 204 becomes easier. The quality and reliability of the conductive contacts 204 are also improved.

In some embodiments, a patterned hard mask may be formed to assist in the formation of the contact openings containing the conductive contacts 204. In some embodiments, the openings formed in the patterned hard mask are smaller or shorter than the desired contact openings. The photolithography process may be easier to perform. In some embodiments, a directional etching process is used to enlarger (or elongate) the contact opening formed in the dielectric layer. The contact openings with desired profile may still be obtained.

Embodiments of the disclosure selectively form conductive contacts between selective epitaxial structures and conductive lines that are not directly above the selective epitaxial structures. Conductive vias are used to form electrical connections between the selective conductive contacts and the conductive lines. On the other hands, the conductive contacts are prevented from being formed on other epitaxial structures with conductive lines formed directly above. Conductive vias are used to form direct electrical connections between the epitaxial structures and the conductive lines aligned with each other. Since the conductive contacts are selectively formed over specific regions, the density of the conductive contacts is significantly reduced. The formation of the conductive contacts is therefore easier. Short circuiting is prevented between the conductive contacts. The quality and reliability of the semiconductor device structure are greatly improved.

In accordance with some embodiments, a semiconductor device structure is provided. The semiconductor device structure includes a semiconductor substrate. The semiconductor device structure also includes a first source/drain structure and a second source/drain structure over the semiconductor substrate. The semiconductor device structure further includes a conductive contact disposed over the first source/drain structure and electrically connected to the first source/drain structure. In addition, the semiconductor device structure includes a first conductive line disposed over the conductive contact and electrically connected to the conductive contact through a first conductive via. The semiconductor device structure includes a dielectric layer surrounding the first conductive via and the conductive contact. The semiconductor device structure also includes a second conductive line electrically connected to the second source/drain structure through a second conductive via. The second conductive via is aligned with the second conductive line and the second source/drain structure.

In accordance with some embodiments, a semiconductor device structure is provided. The semiconductor device structure includes a first epitaxial structure and a second epitaxial structure over a semiconductor substrate. The semiconductor device structure also includes a first conductive via electrically connected to the first epitaxial structure through a conductive contact. The first conductive via is misaligned with the first epitaxial structure. The semiconductor device structure further includes a second conductive via electrically connected to the second epitaxial structure. The second conductive via is aligned with the second epitaxial structure.

In accordance with some embodiments, a method for forming a semiconductor device structure is provided. The method includes method for forming a semiconductor device structure. The method also includes forming a dielectric layer over the first epitaxial structure and the second epitaxial structure and forming a conductive contact on the first epitaxial structure. The method further includes forming a first conductive via over the conductive contact. The first conductive via is misaligned with the first epitaxial structure. In addition, the method includes forming a second conductive via directly above the second epitaxial structure. The second conductive via is longer than the first conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first source/drain structure and a second source/drain structure over a semiconductor substrate;
    forming a dielectric layer over the first source/drain structure and the second source/drain structure;
    forming a conductive contact on the first source/drain structure;
    forming a first conductive via over the conductive contact, wherein the first conductive via is misaligned with the first source/drain structure; and
    forming a second conductive via directly above the second source/drain structure, wherein the second conductive via is longer than the first conductive via.

2. The method for forming a semiconductor device structure as claimed in claim 1, further comprising:
    forming a first opening in the dielectric layer to expose the conductive contact;

forming a second opening in the dielectric layer, wherein the second opening exposes the second source/drain structure; and forming a conductive material in the first opening and the second opening to form the first conductive via and the second conductive via, respectively.

3. The method for forming a semiconductor device structure as claimed in claim 2, wherein the first opening is formed before the second opening.

4. The method for forming a semiconductor device structure as claimed in claim 2, wherein the first opening and the second opening are formed in different etching processes.

5. The method for forming a semiconductor device structure as claimed in claim 1, further comprising:

forming a first conductive line on the first conductive via; and forming a second conductive line on the second conductive via, wherein a portion of the second conductive line is directly above the second source/drain structure.

6. The method for forming a semiconductor device structure as claimed in claim 1, further comprising:

etching back the conductive contact such that a top surface of the conductive contact is lower than a top surface of the dielectric layer; and forming a protective element over the conductive contact before the first conductive via is formed.

7. The method for forming a semiconductor device structure as claimed in claim 6, further comprising:

forming a protective material layer over the conductive contact after the etching back of the conductive contact; and partially removing the protective material layer using a planarization process, wherein a remaining portion of the protective material layer forms the protective element.

8. The method for forming a semiconductor device structure as claimed in claim 6, wherein a top surface of the protective element is substantially level with the top surface of the dielectric layer.

9. The method for forming a semiconductor device structure as claimed in claim 6, further comprising:

partially removing the protective element to form an opening exposing the conductive contact;

forming a conductive material layer to fill the opening; and partially removing the conductive material layer using a planarization process, wherein a remaining portion of the conductive material layer forms the first conductive via.

10. The method for forming a semiconductor device structure as claimed in claim 6, further comprising:

partially removing the protective element to form a first opening exposing the conductive contact;

partially removing the dielectric layer to form a second opening exposing the second source/drain structure;

forming a conductive material layer to fill the first opening and the second opening; and partially removing the conductive material layer using a planarization process, wherein a first remaining portion and a second remaining portion of the conductive material layer form the first conductive via and the second conductive via, respectively.

11. A method for forming a semiconductor device structure, comprising:

forming a first source/drain structure and a second source/drain structure over a semiconductor substrate;

forming a dielectric layer over the first source/drain structure and the second source/drain structure;

forming a first opening laterally surrounded by the dielectric layer, wherein the first opening is vertically misaligned with the first source/drain structure;

forming a second opening laterally surrounded by the dielectric layer, wherein the second opening exposes the second source/drain structure;

forming a first conductive via in the first opening; and forming a second conductive via in the second opening, wherein a top of the second conductive via is substantially level with a top of the first conductive via.

12. The method for forming a semiconductor device structure as claimed in claim 11, further comprising:

forming a conductive contact electrically connected to the first source/drain structure;

etching back the conductive contact such that a top surface of the conductive contact is lower than a top surface of the dielectric layer; and forming a protective element over the conductive contact before the first conductive via is formed.

13. The method for forming a semiconductor device structure as claimed in claim 12, further comprising partially removing the protective element such that the first opening is formed.

14. The method for forming a semiconductor device structure as claimed in claim 11, further comprising:

forming a conductive material layer to fill the first opening and the second opening; and partially removing the conductive material layer, wherein a first remaining portion and a second remaining portion of the conductive material layer form the first conductive via and the second conductive via, respectively.

15. The method for forming a semiconductor device structure as claimed in claim 11, wherein the second opening is deeper than the first opening.

16. A method for forming a semiconductor device structure, comprising:

forming a first source/drain structure and a second source/drain structure over a semiconductor substrate;

forming a conductive contact electrically connected to the first source/drain structure;

forming a protective element over the conductive contact;

forming a first conductive via to penetrate through the protective element and to electrically connect the conductive contact; and forming a second conductive via electrically connected to the second source/drain structure, wherein the second conductive via is longer than the first conductive via.

17. The method for forming a semiconductor device structure as claimed in claim 16, wherein the first conductive via is formed to be vertically misaligned with the first source/drain structure.

18. The method for forming a semiconductor device structure as claimed in claim 16, wherein the second conductive via is formed to be vertically aligned with the second source/drain structure.

19. The method for forming a semiconductor device structure as claimed in claim 16, wherein the protective element is formed to have a sidewall, and the sidewall directly meets a sidewall of the conductive contact.

20. The method for forming a semiconductor device structure as claimed in claim 16, wherein the second conductive via is formed to have an inclined portion, and the inclined portion extends downwards to exceed the interface between the first conductive via and the conductive contact.

* * * * *